US012805068B2

(12) United States Patent
Kang

(10) Patent No.: US 12,805,068 B2
(45) Date of Patent: Nov. 17, 2026

(54) LIGHT EMITTING DIODE AND DISPLAY DEVICE INCLUDING THE SAME

(71) Applicant: LG Display Co., Ltd., Seoul (KR)

(72) Inventor: MinJae Kang, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 241 days.

(21) Appl. No.: 18/782,867

(22) Filed: Jul. 24, 2024

(65) Prior Publication Data

US 2025/0221101 A1 Jul. 3, 2025

(30) Foreign Application Priority Data

Dec. 28, 2023 (KR) ........................ 10-2023-0194991

(51) Int. Cl.

| | |
|---|---|
| ***H10H 20/821*** | (2025.01) |
| ***H10H 20/831*** | (2025.01) |
| ***H10H 20/84*** | (2025.01) |
| ***H10H 20/857*** | (2025.01) |
| ***H10W 90/00*** | (2026.01) |

(52) U.S. Cl.

CPC ...... *H10H 20/821* (2025.01); *H10H 20/8314* (2025.01); *H10H 20/84* (2025.01); *H10H 20/857* (2025.01); *H10W 90/00* (2026.01)

(58) Field of Classification Search

CPC .. H10H 20/821; H10H 20/8314; H10H 20/84; H10H 20/857

See application file for complete search history.

(56) References Cited

U.S. PATENT DOCUMENTS

| | | | | |
|---|---|---|---|---|
| 2010/0308358 | A1* | 12/2010 | Bae | H10H 20/018 257/E33.013 |
| 2022/0262854 | A1* | 8/2022 | Park | H10H 20/821 |
| 2024/0021753 | A1* | 1/2024 | Tonkikh | H10H 20/013 |
| 2025/0221110 | A1* | 7/2025 | Kim | H10H 20/01 |

* cited by examiner

*Primary Examiner* — Christine A Enad

(74) *Attorney, Agent, or Firm* — Fenwick & West LLP

(57) ABSTRACT

A light emitting diode includes a base layer, a first semiconductor layer surrounding a side surface of the base layer, a first electrode on a first surface of the first semiconductor layer, the first electrode electrically connected with the first semiconductor layer, and a second electrode on a second surface of the first semiconductor layer that is opposite to the first surface, the second electrode electrically connected with the first semiconductor layer, wherein the first electrode and the second electrode overlap each other.

20 Claims, 9 Drawing Sheets

220 : 221, 222, 223, 224, 225

LIGHT EMITTING DIODE AND DISPLAY DEVICE INCLUDING THE SAME

CROSS-REFERENCE TO RELATED APPLICATION

This application claims the priority of Republic of Korea Patent Application No. 10-2023-0194991 filed on Dec. 28, 2023, which is hereby incorporated by reference in its entirety.

BACKGROUND

Field

The present disclosure relates to a light-emitting diode and display devices including the same.

Description of the Related Art

The display device is widely used as a display screen of a notebook computer, a tablet computer, a smart phone, a portable display device, and a portable information device in addition to a display screen of a television or a monitor. A liquid crystal display device and an organic light emitting display device display an image using a thin film transistor as a switching element. Since the liquid crystal display device is not a self-emitting device, the image is displayed using light irradiated from a backlight unit disposed under the liquid crystal display panel. Since such the liquid crystal display device has the backlight unit, design is limited, and luminance and response speed may be deteriorated. Since the organic light emitting display device includes an organic material, it is vulnerable to moisture, and thus reliability and lifespan may be deteriorated.

In recent years, research and development of the light emitting diode display device using a micro-light emitting diode are in the spotlight as a next-generation display because of its high quality and high reliability.

In order to implement a high-definition light emitting diode display device, it is necessary to apply a micro-LED (uLED) having a small size. And, in order to implement the high-quality light emitting diode display device, a process of transferring the light emitting diode to a substrate is necessary. In this case, since the micro-LED has a very small size, it may not be accurately transferred to the substrate. For example, when a lower surface of the light emitting diode needs to be transferred to be in contact with the substrate, the light emitting diode is turned over during the transfer process, and an upper surface of the light emitting diode may be in contact with the substrate. Accordingly, an electrode of the light emitting diode may not be normally connected with a driving element or a power line. Therefore, a problem of lighting defects may occur.

SUMMARY

The present disclosure has been made in view of the above problems and it is an object of the present disclosure to provide a light emitting diode having a symmetrical structure and a method of manufacturing the same.

In accordance with an aspect of the present disclosure, the above and other objects can be accomplished by the provision of a light emitting diode comprising: a base layer; a first semiconductor layer surrounding a side surface of the base layer; a first electrode on a first surface of the first semiconductor layer, the first electrode electrically connected with the first semiconductor layer; and a second electrode on a second surface of the first semiconductor layer that is opposite to the first surface, the second electrode electrically connected with the first semiconductor layer, wherein the first electrode and the second electrode overlap each other.

In accordance with an aspect of the present disclosure, the above and other objects can be accomplished by the provision of a display device comprising: a common voltage line; a thin film transistor on a substrate; and a light emitting diode on the substrate, the light emitting diode including a first semiconductor layer, a second semiconductor layer surrounding a side surface of the first semiconductor layer, a first electrode electrically connected with the first semiconductor layer, a second electrode electrically connected with the first semiconductor layer, a third electrode electrically connected with the second semiconductor layer, and a fourth electrode electrically connected with the second semiconductor layer, wherein one of the first electrode and the second electrode is electrically connected with the thin film transistor through a first connection electrode, and one of the third electrode and the fourth electrode is electrically connected with the common voltage line through a second connection electrode.

In accordance with an aspect of the present disclosure, the above and other objects can be accomplished by the provision of a light emitting diode comprising: a base layer including a first surface and a second surface opposite to the first surface of the base layer; a first semiconductor layer including a first surface and a second surface opposite to the first surface of the first semiconductor layer, the first semiconductor layer in contact with a side surface of the base layer and surrounding the side surface of the base layer, the first surface of the first semiconductor layer located on a same plane as the first surface of the base layer; an active layer including a first surface and a second surface opposite to the first surface of the active layer, the active layer in contact with a side surface of the first semiconductor layer and surrounding the side surface of the first semiconductor layer, the first surface of the active layer located on the same plane as the first surface of the first semiconductor layer; a second semiconductor layer including a first surface and a second surface opposite to the first surface of the second semiconductor layer, the second semiconductor layer in contact with a side surface of the active layer and surrounding the side surface of the active layer, the first surface of the second semiconductor layer located on the same plane as the first surface of the active layer; a first pair of overlapping electrodes on the first surface and the second surface of the first semiconductor layer and the first surface and the second surface of the base layer, the first pair of overlapping electrodes electrically connected with the first semiconductor layer; and a second pair of overlapping electrodes on the first surface and the second surface of the second semiconductor layer, the second pair of overlapping electrodes electrically connected with the second semiconductor layer.

DETAILED DESCRIPTION

Figure 1:
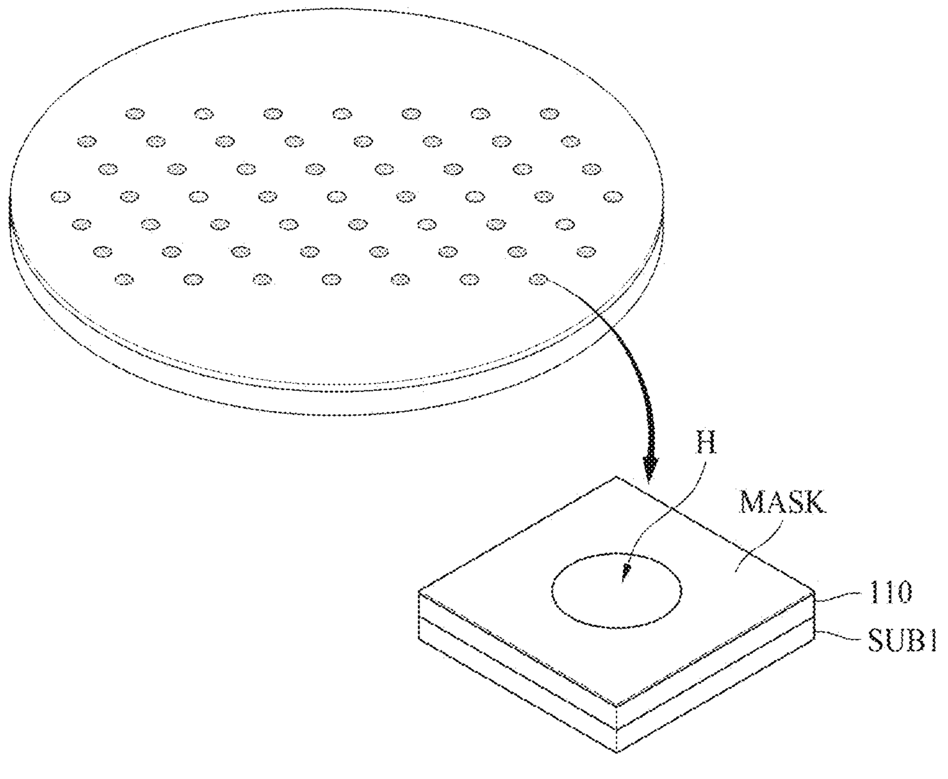
FIGS. 1 through 13 are diagrams illustrating a process of manufacturing a light emitting diode according to an embodiment of the present disclosure.

Advantages and features of the present disclosure and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete and will fully convey the scope of the present disclosure to those skilled in the art.

A shape, a size, a ratio, an angle and a number disclosed in the drawings for describing embodiments of the present disclosure are merely an example and thus, the present disclosure is not limited to the illustrated details. Like reference numerals refer to like elements throughout the specification. In the following description, when the detailed description of the relevant known function or configuration is determined to unnecessarily obscure the important point of the present disclosure, the detailed description will be omitted. In a case where "comprise", "have" and "include" described in the present disclosure are used, another portion may be added unless "only" is used. The terms of a singular form may include plural forms unless referred to the contrary.

In construing an element, the element is construed as including an error band although there is no explicit description.

In describing a position relationship, for example, when the position relationship is described as "upon", "above", "below" and "next to", one or more portions may be disposed between two other portions unless "just" or "direct" is used.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

Features of various embodiments of the present disclosure may be partially or overall coupled to or combined with each other and may be variously inter-operated with each other and driven technically as those skilled in the art can sufficiently understand. The embodiments of the present disclosure may be carried out independently from each other or may be carried out together in a co-dependent relationship.

Hereinafter, the preferred embodiment of the present disclosure will be described in detail with reference to the accompanying drawings.

FIGS. 1 through 13 are views illustrating a process of manufacturing a light emitting diode according to an embodiment of the present disclosure. FIGS. 1 through 13 may be implemented by processing methods such as metal organic chemical vapor deposition (MOCVD), molecular beam epitaxy (MBE), plasma enhanced chemical vapor deposition (PECVD), and vapor phase epitaxy (VPE).

Referring to FIG. 1, a base layer 110 may be formed on a first substrate SUB1. The base layer 110 may be formed of a semiconductor material such as GaN, AlGaN, InGaN, or AlInGaN, and may be in an undoped state.

A mask MASK may be formed on the base layer 110. The mask MASK may include a plurality of holes H. That is, the mask MASK may expose a portion of an upper surface of the base layer 110 through the plurality of holes H. Each of the plurality of holes H is spaced apart from each other and may have a circular shape.

Figure 2:
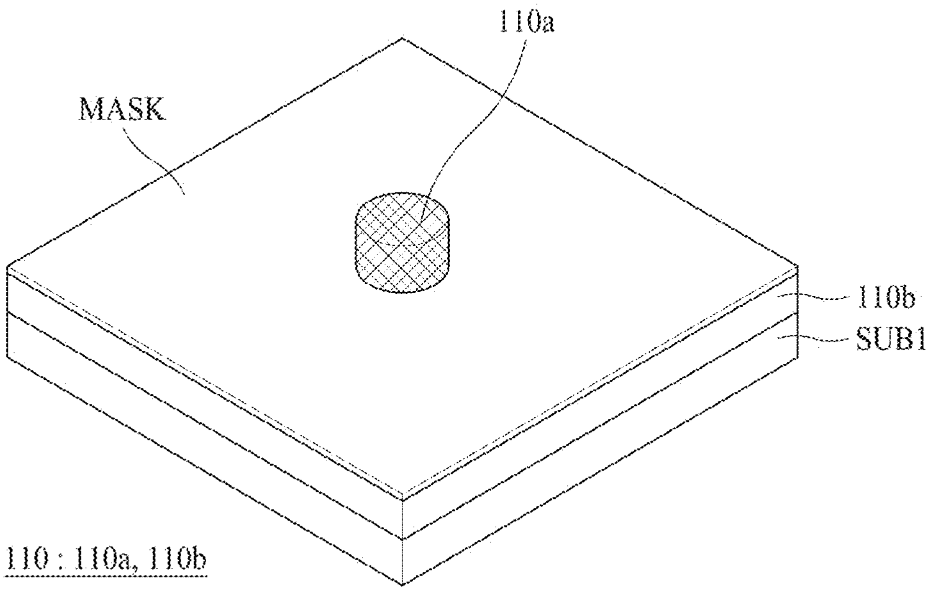

Referring to FIG. 2, the base layer 110 may be grown in a direction perpendicular to a top surface of the first substrate SUB1. The base layer 110 may be grown along the shape of the plurality of holes H of the mask MASK. Accordingly, the base layer 110 may have a protrusion portion 110*a* and a flat portion 110*b*. Referring to FIG. 2, the plurality of holes H have the circular shape, and thus the protrusion portion 110*a* may have a cylindrical shape. FIG. 2 illustrates that the protrusion portion 110*a* has the cylindrical shape, and the description is not limited thereto. For example, the protrusion portion 110*a* may be an elliptical pillar having an elliptical cross section or a polyhedron having a polygonal cross section.

Figure 3:
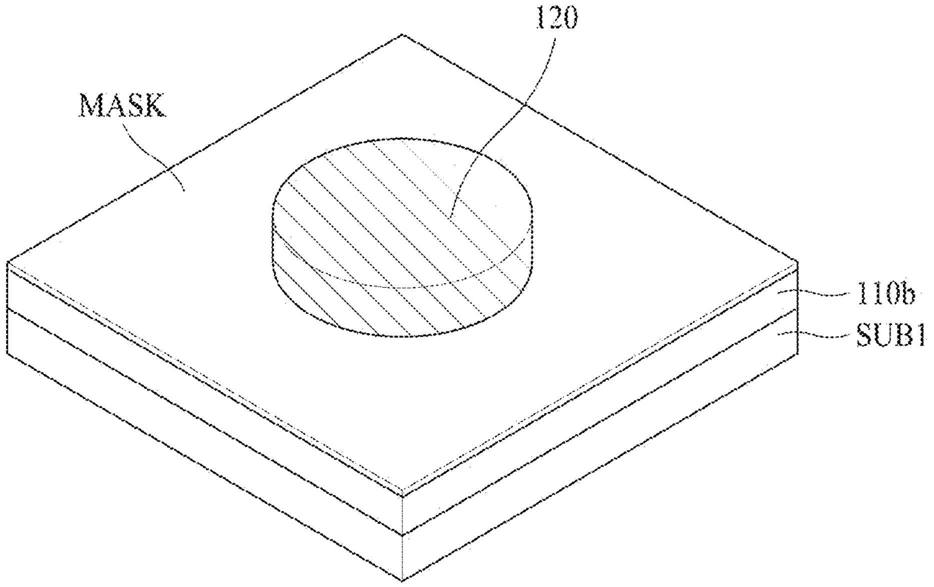

Referring to FIG. 3, an n-type semiconductor layer 120 may be formed on the protrusion portion 110*a* of the base layer 110. The n-type semiconductor layer 120 may be formed by growing the base layer 110 and then doping an n-type impurity. That is, the n-type semiconductor layer 120 may be formed of an n-GaN-based semiconductor material such as GaN, AlGaN, InGaN, or AlInGaN. Also, Si, Ge, Se, Te, C or the like may be used as the impurity for doping the n-type semiconductor layer 120, but is not limited thereto.

The n-type semiconductor layer 120 may cover both a top surface and a side surface of the protrusion portion 110*a* of the base layer 110. Also, the n-type semiconductor layer 120 may be formed to correspond to a shape of the protrusion portion 110*a* of the base layer 110. That is, since the protrusion portion 110*a* of the base layer 110 has the cylindrical shape, the n-type semiconductor layer 120 may also be formed in the cylindrical shape.

With respect to the upper surface of the first substrate SUB1, an amount of the n-type semiconductor layer 120 grown in the horizontal direction may be greater than an amount of the n-type semiconductor layer 120 grown in the vertical direction. That is, a distance from an upper surface of the protrusion portion 110*a* of the base layer 110 to an upper surface of the n-type semiconductor layer 120 may be less than a distance from a side surface of the protrusion portion 110*a* of the base layer 110 to a side surface of the n-type semiconductor layer 120.

Figure 4:
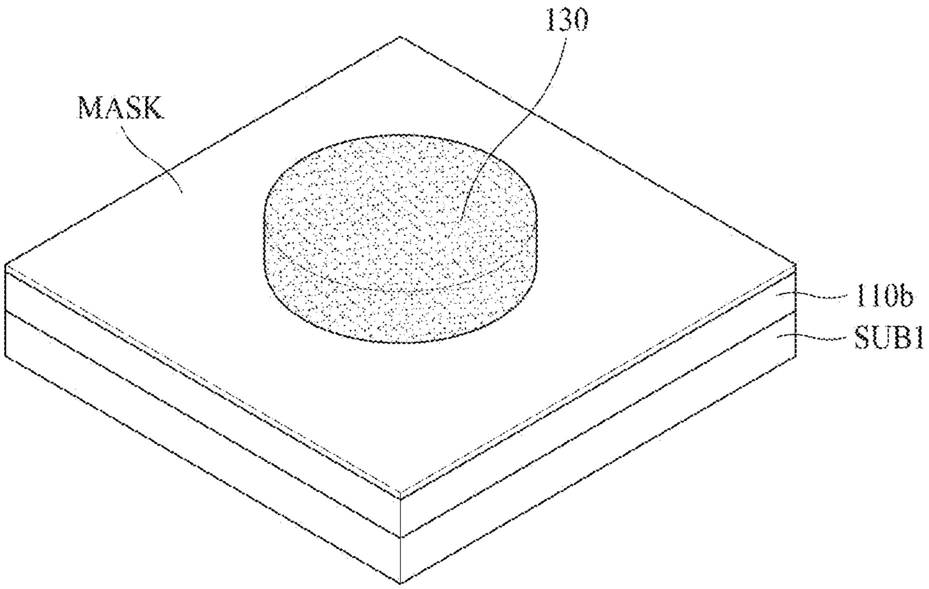

Referring to FIG. 4, an active layer 130 may be formed on the n-type semiconductor layer 120. The active layer 130 may fully cover a top surface and a side surface of the n-type semiconductor layer 120. Also, the active layer 130 may be formed to correspond to a shape of the n-type semiconductor layer 120. That is, since the n-type semiconductor layer 120 has the cylindrical shape, the active layer 130 may also be formed in the cylindrical shape.

With respect to the upper surface of the first substrate SUB1, an amount of the active layer 130 grown in the vertical direction and an amount of the active layer 130 grown in the horizontal direction may be the same. That is, the active layer 130 may have a uniform thickness.

The active layer 130 may be a light emitting layer that emits light. The active layer 130 may have a multi-quantum well (MQW) structure having a well layer and a barrier layer having a band gap higher than that of the well layer. For example, the active layer 130 may have the multi-quantum well structure such as InGaN/GaN, but is not limited thereto.

Figure 5:
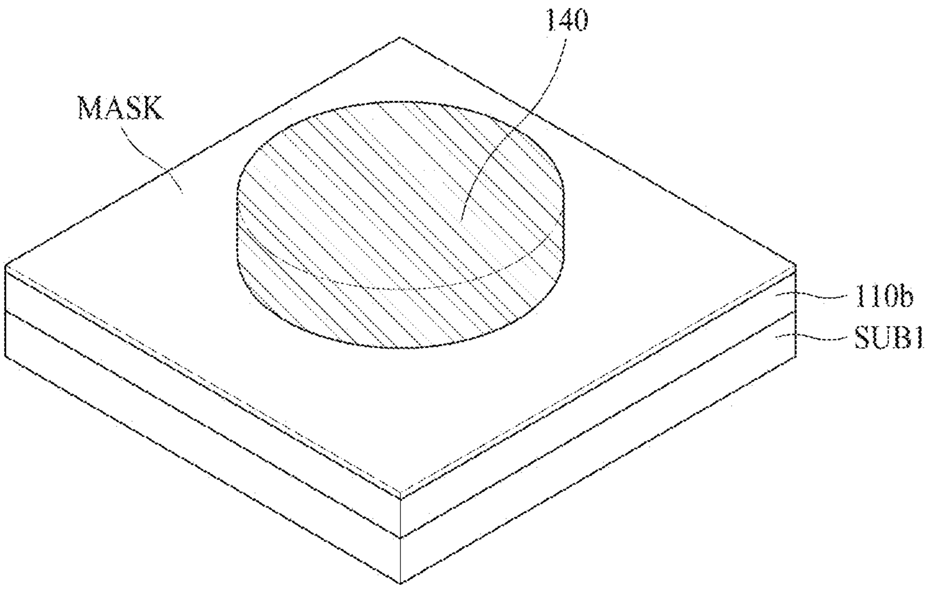

Referring to FIG. 5, a p-type semiconductor layer 140 may be formed on the active layer 130. The p-type semiconductor layer 140 may be formed of a p-GaN-based semiconductor material such as GaN, AlGaN, InGaN, or AlInGaN. Also, Mg, Zn, Be or the like may be used as the impurity for doping the p-type semiconductor layer 140, but is not limited thereto.

The p-type semiconductor layer 140 may cover both a top surface and a side surface of the active layer 130. Also, the p-type semiconductor layer 140 may be formed to correspond to a shape of the active layer 130. That is, since the active layer 130 has the cylindrical shape, the p-type semiconductor layer 140 may also be formed in the cylindrical shape.

With respect to the upper surface of the first substrate SUB1, an amount of the p-type semiconductor layer 140 grown in the horizontal direction may be greater than an amount of the p-type semiconductor layer 140 grown in the vertical direction. That is, a distance from an upper surface of the active layer 130 to an upper surface of the p-type semiconductor layer 140 may be less than a distance from a side surface of the active layer 130 to a side surface of the p-type semiconductor layer 140.

Figure 6:
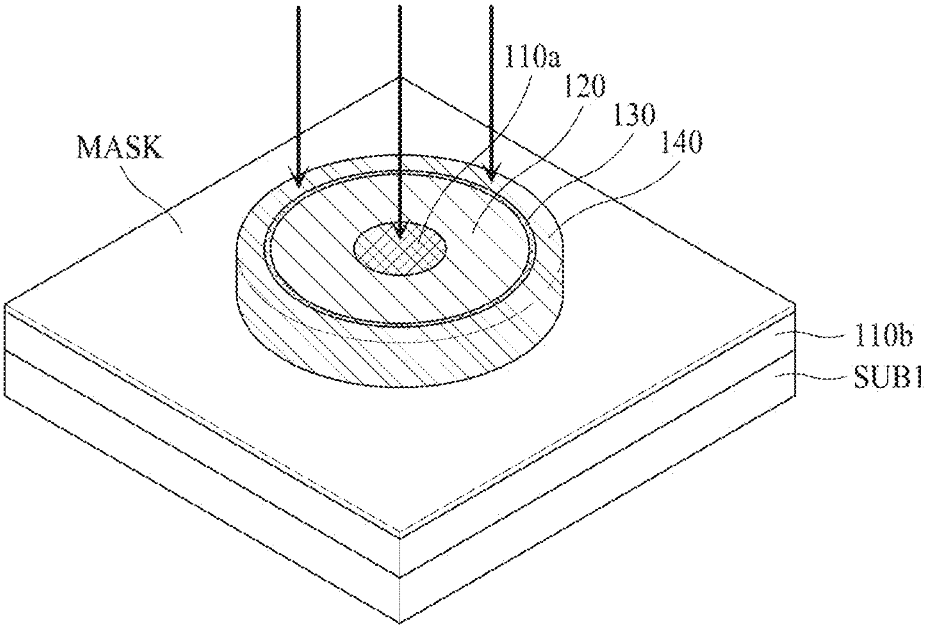

Referring to FIG. 6, an etching process may be performed in a vertical direction on the top surface of the first substrate SUB1. Some regions of the n-type semiconductor layer 120, the active layer 130, and the p-type semiconductor layer 140 may be etched by the etching process. Accordingly, a top surface of the n-type semiconductor layer 120, and a top surface of the active layer 130, and a top surface of the protrusion portion 110*a* of the base layer 110 may be exposed. Also, the top surface of the protrusion portion 110*a*, the top surface of the n-type semiconductor layer 120, the top surface of the active layer 130, and the top surface of the p-type semiconductor layer 140 may be located on the same plane. Additionally, the lower surface of the base layer 110, the lower surface of the n-type semiconductor layer 120, the lower surface of the active layer 130, and the lower surface of the p-type semiconductor layer 140 may be located on the same plane.

The n-type semiconductor layer 120 may surround the side surface of the protrusion portion 110*a* of the base layer 110 without covering the top surface of the protrusion portion 110*a* of the base layer 110. Also, the active layer 130 may surround the side surface of the n-type semiconductor layer 120 without covering the top surface of the n-type semiconductor layer 120. Also, the p-type semiconductor layer 140 may surround the side surface of the active layer 130 without covering the top surface of the active layer 130.

Figure 7:
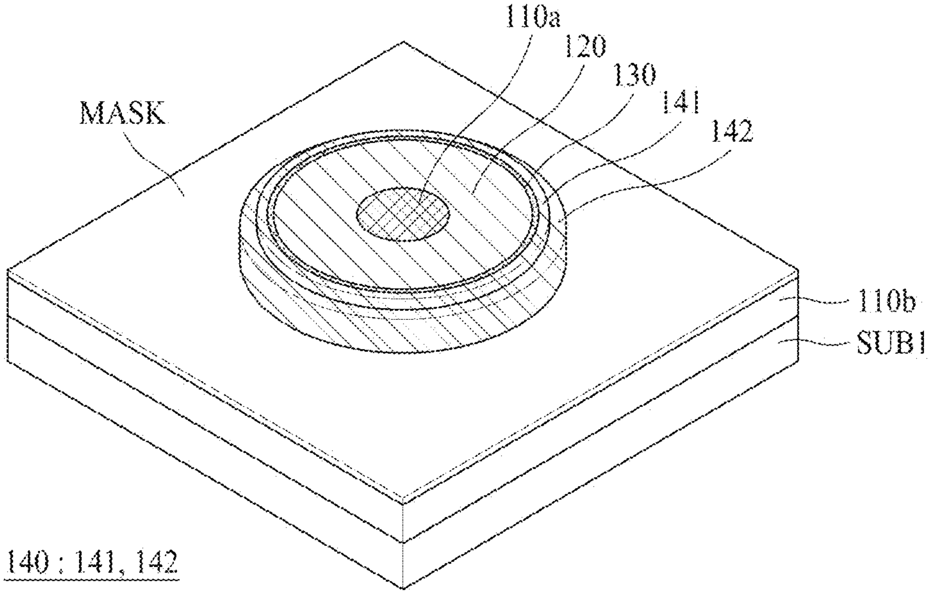

Referring to FIG. 7, a portion of an upper surface of the p-type semiconductor layer 140 may be etched. Accordingly, the p-type semiconductor layer 140 may include a first region 141 and a second region 142 having a thickness smaller than that of the first region 141. That is, the region in which a portion of the upper surface of the p-type semiconductor layer 140 is etched may be the second region 142.

Each of the first and second regions 141 and 142 may have a shape surrounding the side surface of the active layer 130. Also, the first region 141 may be closer to the active layer 130 than the second region 142. That is, the first region 141 may be in contact with the active layer 130 and may surround the side surface of the active layer 130. Also, the second region 142 may be an outer region of the p-type semiconductor layer 140 and may surround a side surface of the first region 141. The second region 142 may expose a portion of the side surface of the first region 141.

Figure 8:
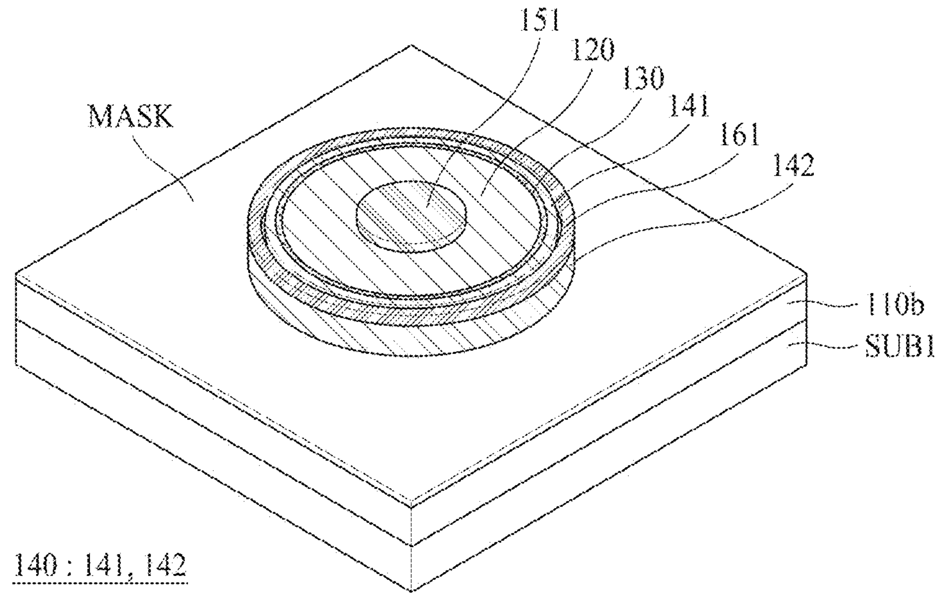

Referring to FIG. 8, a first n-type electrode 151 and a first p-type electrode 161 may be formed.

The first n-type electrode 151 may be formed on the protrusion portion 110*a* of the base layer 110 and the n-type semiconductor layer 120. A central region of the first n-type electrode 151 may be in contact with the protrusion portion 110*a* of the base layer 110, and an outer region of the first n-type electrode 151 may be in contact with the n-type semiconductor layer 120.

The first n-type electrode 151 may entirely cover the upper surface of the protrusion portion 110*a* of the base layer 110 and may partially cover the upper surface of the n-type semiconductor layer 120. That is, an area of a lower surface of the first n-type electrode 151 may be larger than an area of the upper surface of the protrusion portion 110*a* of the base layer 110. Also, the first n-type electrode 151 may have the cylindrical shape, may be the elliptical pillar having the elliptical cross section, or the polyhedron having the polygonal cross section, but is not limited thereto.

The first p-type electrode 161 may be formed on the second region 142 of the p-type semiconductor layer 140. The first p-type electrode 161 may have a shape corresponding to the second region 142 of the p-type semiconductor layer 140 and may have a ring shape.

An area of the first p-type electrode 161 may be smaller than an area of an upper surface of the second region 142 of the p-type semiconductor layer 140. Also, a side surface of the first p-type electrode 161 may not protrude from an outer surface of the p-type semiconductor layer 140. Also, the side surface of the first p-type electrode 161 may not be in contact with a side surface of the first region 141 of the p-type semiconductor layer 140. A height of an upper surface of the first p-type electrode 161 may be the same as or lower than a height of the upper surface of the first region 141 of the p-type semiconductor layer 140, but is not limited thereto.

Each of the first n-type electrode 151 and the first p-type electrode 161 may include a metal material such as Au, W, Pt, Si, Ir, Ag, Cu, Ni, Ti, or Cr, and an alloy thereof. Alternatively, each of the first n-type electrode 151 and the first p-type electrode 161 may include a transparent conductive material such as an indium tin oxide (ITO) or an indium zinc oxide (IZO).

Figure 9:
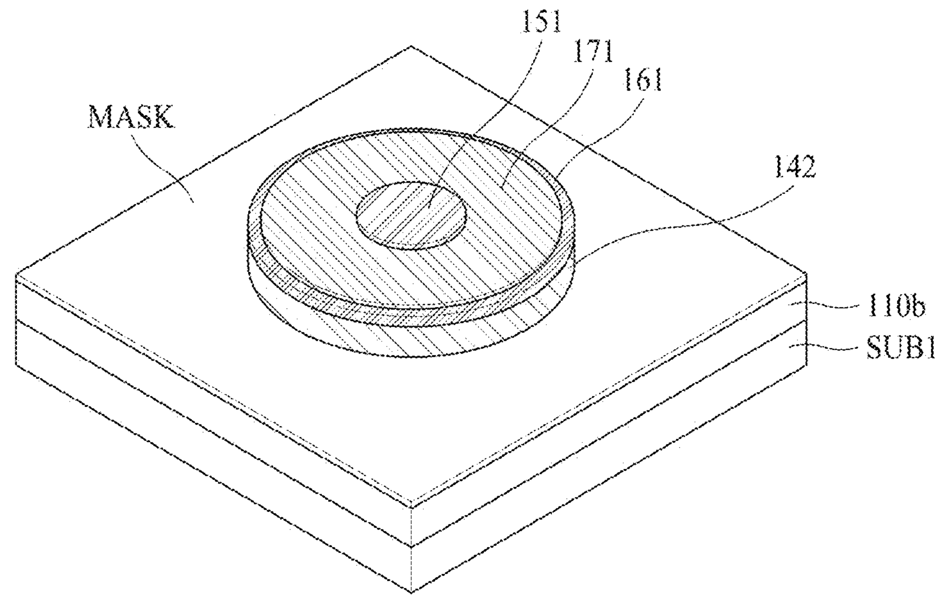

Referring to FIG. 9, a first protective layer 171 may be formed.

The first protective layer 171 may cover the entire upper surfaces of the n-type semiconductor layer 120, the active layer 130, and the p-type semiconductor layer 140. Also, the first protective layer 171 may be in contact with the side surface of the first n-type electrode 151 and may expose the upper surface of the first n-type electrode 151. That is, the first protective layer 171 may have a ring shape surrounding the side surface of the first n-type electrode 151. Alternatively, the first protective layer 171 may cover a part of the upper surface of the first n-type electrode 151. Also, a thickness of the first protective layer 171 may be less than a thickness of the first n-type electrode 151.

When the first p-type electrode 161 and the first region 141 of the p-type semiconductor layer 140 are spaced apart from each other, the first protective layer 171 may fill a space between the first p-type electrode 161 and the first region 141 of the p-type semiconductor layer 140.

The first protective layer 171 may be formed of an inorganic insulating material such as silicon oxide (SiOx), silicon nitride (SiNx), or silicon oxynitride (SiOxNy).

Figure 10:
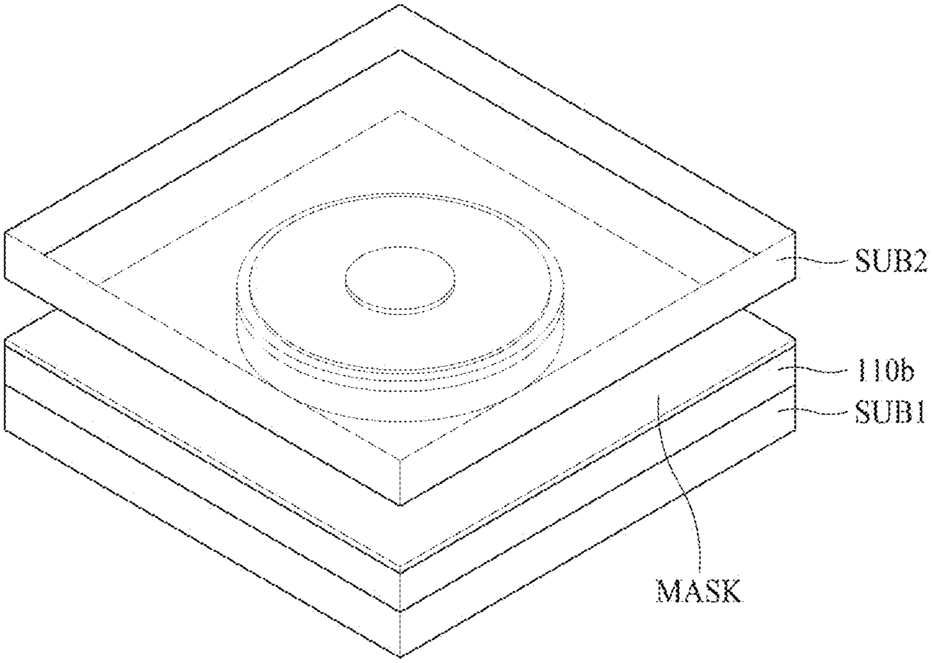

Referring to FIG. 10, a second substrate SUB2 may be fixed to the upper surface of the first n-type electrode 151. The second substrate SUB2 is connected with a device such as a lift, and may float on a structure formed by the processes of FIGS. 1 through 9. Then, the first substrate SUB1, the flat portion 110*b* of the base layer 110, and the mask MASK may be removed.

In addition, the structure formed by the process of FIGS. 1 through 9 may be reversed so that the second substrate SUB2 may be disposed below the structure formed by the process of FIGS. 1 through 9. Accordingly, it may be disposed as shown in FIG. 11.

Figure 11:
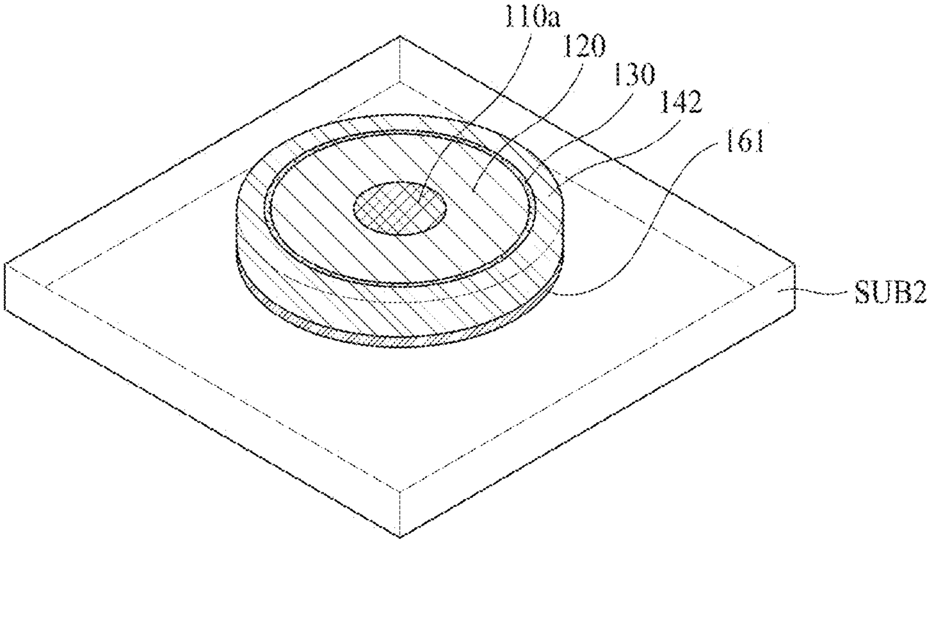

Referring to FIG. 11, since the first substrate SUB1, the flat portion 110*b* of the base layer 110, and the mask MASK are removed, the upper surface of the n-type semiconductor layer 120, the upper surface of the active layer 130, and the upper surface of the protrusion portion 110*a* of the base layer 110 may be exposed. Also, the upper surface of the protrusion portion 110*a*, the upper surface of the n-type semiconductor layer 120, the upper surface of the active layer 130, and the upper surface of the p-type semiconductor layer 140 may be located on the same plane.

The n-type semiconductor layer 120 may surround the side surface of the protrusion portion 110*a* of the base layer 110 without covering the top surface of the protrusion portion 110*a* of the base layer 110. Also, the active layer 130 may surround the side surface of the n-type semiconductor layer 120 without covering the top surface of the n-type semiconductor layer 120. Also, the p-type semiconductor layer 140 may surround the side surface of the active layer 130 without covering the top surface of the active layer 130.

Figure 12:
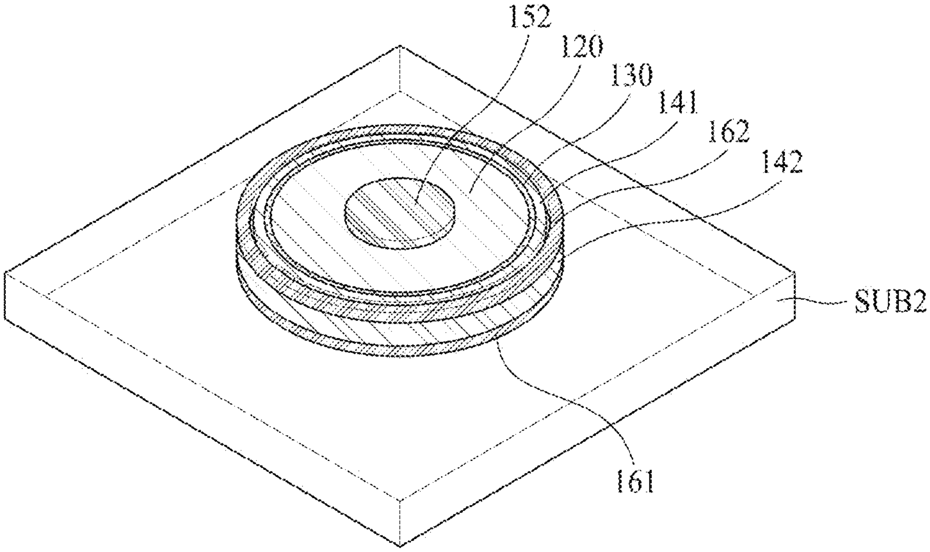

Referring to FIG. 12, a second n-type electrode 152 and a second p-type electrode 162 may be formed.

Specifically, as described in FIG. 7, a portion of the upper surface of the p-type semiconductor layer 140 may be etched. Accordingly, the p-type semiconductor layer 140 may include the first region 141 and the second region 142 having a thickness smaller than that of the first region 141. That is, the region in which the portion of the upper surface of the p-type semiconductor layer 140 is etched may be the second region 142. In this case, the second region 142 formed on the upper portion of the p-type semiconductor layer 140 and the second region 142 formed on the lower portion of the p-type semiconductor layer 140 may overlap.

In addition, like the process of forming the first n-type electrode 151 and the first p-type electrode 161 described above in FIG. 8, the second n-type electrode 152 and the second p-type electrode 162 may be formed. Also, the first n-type electrode 151 and the second n-type electrode 152 may overlap, and the first p-type electrode 161 and the second p-type electrode 162 may overlap.

The second n-type electrode 152 may be formed on the protrusion portion 110*a* of the base layer 110 and the n-type semiconductor layer 120. A central region of the second n-type electrode 152 may be in contact with the protrusion portion 110*a* of the base layer 110, and an outer region of the second n-type electrode 152 may be in contact with the n-type semiconductor layer 120.

The second n-type electrode 152 may entirely cover the upper surface of the protrusion portion 110*a* of the base layer 110 and may partially cover the upper surface of the n-type semiconductor layer 120. That is, an area of a lower surface of the second n-type electrode 152 may be larger than the area of the upper surface of the protrusion portion 110*a* of the base layer 110. Also, the second n-type electrode 152 may have the cylindrical shape.

The second p-type electrode 162 may be formed on the second region 142 of the p-type semiconductor layer 140. The second p-type electrode 162 may have a shape corresponding to the second region 142 of the p-type semiconductor layer 140 and may have a ring shape.

An area of the second p-type electrode 162 may be smaller than the area of the upper surface of the second region 142 of the p-type semiconductor layer 140. Also, a side surface of the second p-type electrode 162 may not protrude from the outer surface of the p-type semiconductor layer 140. Also, the side surface of the second p-type electrode 162 may not be in contact with the side surface of the first region 141 of the p-type semiconductor layer 140. A height of an upper surface of the second p-type electrode 162 may be the same as the height of the upper surface of the first region 141 of the p-type semiconductor layer 140, but is not limited thereto.

Each of the second n-type electrode 152 and the second p-type electrode 162 may include a metal material such as Au, W, Pt, Si, Ir, Ag, Cu, Ni, Ti, or Cr, and an alloy thereof. Alternatively, each of the second n-type electrode 152 and the second p-type electrode 162 may include a transparent conductive material such as an indium tin oxide (ITO) or an indium zinc oxide (IZO). Also, the first and second n-type electrodes 151 and 152 (i.e., first pair of overlapping electrodes) may include the same material, but are not limited thereto. Also, the first and second p-type electrodes 161 and 162 (i.e., second pair of overlapping electrodes) may include the same material, but are not limited thereto. Also, the first and second n-type electrodes 151 and 152 and the first and second p-type electrodes 161 and 162 may include different metals, but are not limited thereto.

Figure 13:
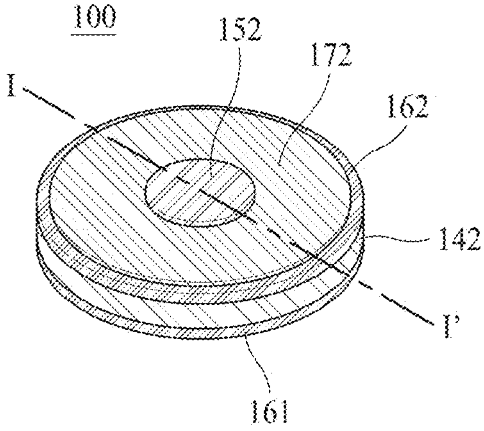

Referring to FIG. 13, a second protective layer 172 may be formed, and the second substrate SUB2 may be removed.

Like the process of forming the first protective layer 171 described above in FIG. 9, the second protective layer 172 may be formed.

The second protective layer 172 may cover the entire upper surfaces of the n-type semiconductor layer 120, the active layer 130, and the p-type semiconductor layer 140. Also, the second protective layer 172 may be in contact with a side surface of the second n-type electrode 152 and may expose an upper surface of the second n-type electrode 152. That is, the second protective layer 172 may have a ring shape surrounding the side surface of the second n-type electrode 152. Alternatively, the second protective layer 172 may cover a part of the upper surface of the second n-type electrode 152. Also, the thickness of the second protective layer 172 may be less than the thickness of the second n-type electrode 152.

When the second p-type electrode 162 and the second region 142 of the p-type semiconductor layer 140 are spaced apart from each other, the second protective layer 172 may fill a space between the second p-type electrode 162 and the second region 142 of the p-type semiconductor layer 140.

The second protective layer 172 may be formed of an inorganic insulating material such as silicon oxide (SiOx), silicon nitride (SiNx), silicon oxynitride (SiOxNy), and the like. Also, the first and second protective layers 171 and 172 may be formed of the same material, but are not limited thereto.

Figure 14:
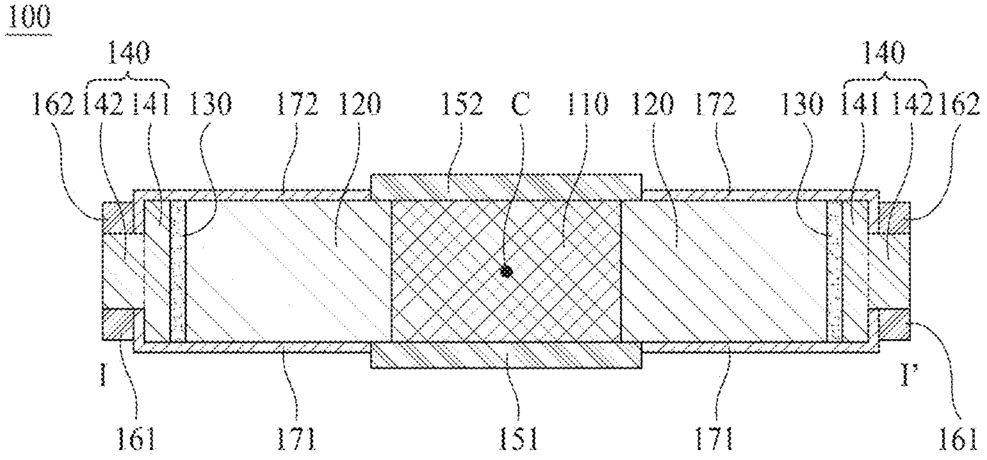
FIG. 14 is a cross-sectional view of a light emitting diode according to an embodiment of the present disclosure.

FIG. 14 is a cross-sectional view of a light emitting diode 100 according to one embodiment of the present disclosure. That is, FIG. 14 is a cross-sectional view taken along line I-I' of FIG. 13.

As described above with reference to FIGS. 1 through 13, the light emitting diode 100 may include the base layer 110, the n-type semiconductor layer 120, the active layer 130, the p-type semiconductor layer 140, the first n-type electrode 151, the second n-type electrode 152, the first p-type electrode 161 and the second p-type electrode 162, the first protective layer 171 and the second protective layer 172.

Referring to FIG. 14, the n-type semiconductor layer 120 may be disposed on the side surface of the base layer 110, the active layer 130 may be disposed on the side surface of the n-type semiconductor layer 120, and the p-type semiconductor layer 140 may be disposed on the side surface of the active layer 130. Also, the first protective layer 171 may cover the lower surface of the n-type semiconductor layer 120, the lower surface of the active layer 130, and the lower surface of the p-type semiconductor layer 140. Also, the second protective layer 172 may cover the top surface of the n-type semiconductor layer 120, the top surface of the active layer 130, and the top surface of the p-type semiconductor layer 140.

The top surface of the base layer 110, the top surface of the n-type semiconductor layer 120, the top surface of the active layer 130, and the top surface of the first region 141 of the p-type semiconductor layer 140 may be located on the same plane. Additionally, the lower surface of the base layer 110, the lower surface of the n-type semiconductor layer 120, the lower surface of the active layer 130, and the lower surface of the first region 141 of the p-type semiconductor layer 140 may be located on the same plane. Also, a thickness of the base layer 110, a thickness of the n-type semiconductor layer 120, a thickness of the active layer 130, and a thickness of the first region 141 of the p-type semiconductor layer 140 may be the same.

The first n-type electrode 151 may be disposed on the lower portion of the base layer 110, and the second n-type electrode 152 may be disposed on the upper portion of the base layer 110. Also, the first and second n-type electrodes 151 and 152 may have the same thickness and may overlap each other. Also, the first p-type electrode 161 may be disposed on the lower portion of the p-type semiconductor layer 140, and the second p-type electrode 162 may be disposed on the upper portion of the p-type semiconductor layer 140. Also, the first and second p-type electrodes 161 and 162 may have the same thickness and may overlap each other.

Accordingly, when a straight line passing through the center C of the base layer 110 and parallel to the upper surface of the base layer 110 is used as a reference line, the light emitting diode 100 may have a symmetrical structure with respect to the reference line. That is, the light emitting diode 100 of the present disclosure may have a symmetrical structure in which the upper structure and the lower structure are the same. Also, when a straight line passing through the center C of the base layer 110 and perpendicular to the upper surface of the base layer 110 is used as the reference line, the light emitting diode 100 may have the symmetrical structure with respect to the reference line. For example, when a line I-I' of FIG. 13 is used as the reference line, the light emitting diode 100 may have the symmetrical structure with respect to the reference line. That is, the light emitting diode 100 of the present disclosure may have the symmetrical structure in which one side structure and the other side structure are substantially the same.

Typically, in a process of transferring the light emitting diode 100 to a substrate of a display device, the light emitting diode may not be accurately transferred to the substrate. For example, a phenomenon in which the upper and lower portions of the light emitting diode are reversed may occur during the transfer process. However, the light emitting diode 100 of the present disclosure may be stably disposed on the substrate of the display device, even when the light emitting diode 100 is flipped, because the upper and lower structures of the light emitting diode 100 are symmetrical.

Also, the present disclosure discloses a structure in which the first n-type electrode 151 and the first p-type electrode 161 are formed in the lower portion of the light emitting diode 100 and the second n-type electrode 152 and the second p-type electrode 162 are formed in the upper portion of the light emitting diode 100. Accordingly, even if the light emitting diode 100 is flipped during the transfer process, the electrode of the light emitting diode 100 may be normally connected with the driving element or the power line. Therefore, the problem of lighting defects may be reduced.

Figure 15:
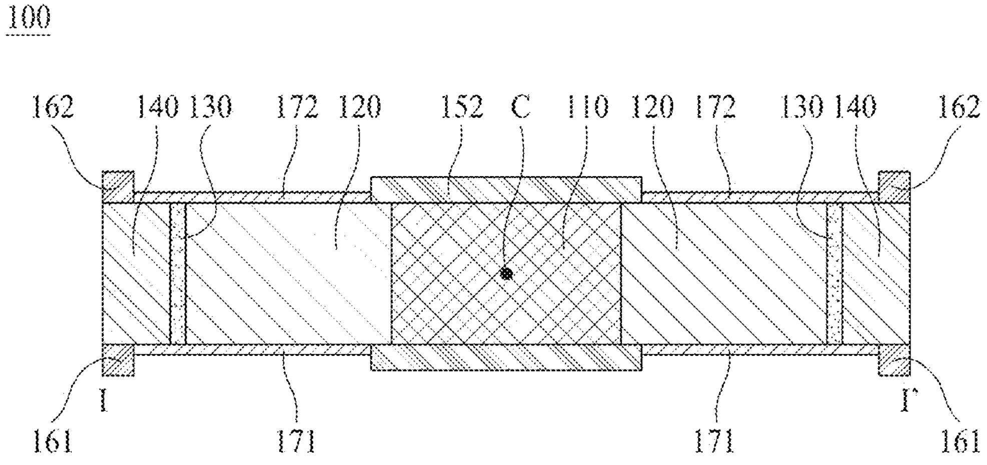
FIG. 15 is a cross-sectional view of a light emitting diode according to another embodiment of the present disclosure.

FIG. 15 is a cross-sectional view of a light emitting diode according to another embodiment of the present disclosure.

Compared with FIG. 14, FIG. 15 illustrates substantially the same structure except for the structure of the p-type semiconductor layer 140. Accordingly, the same reference numerals are used for the same components as for the light emitting diode 100 illustrated in FIG. 14, and repeated descriptions are omitted.

The p-type semiconductor layer 140 of FIG. 14 may include the first region 141 in which a partial region is etched and the second region 142 that is not etched, whereas the p-type semiconductor layer 140 of FIG. 15 may not include the etched region.

Referring to FIG. 15, a step difference is not formed in upper and lower portions of the p-type semiconductor layer 140, and the thickness of the p-type semiconductor layer 140 may be uniform. The p-type semiconductor layer 140 may be in contact with the active layer 130 and may surround the side surface of the active layer 130. Also, the upper surface of the base layer 110, the upper surface of the n-type semiconductor layer 120, the upper surface of the active layer 130, and the upper surface of the p-type semiconductor layer 140 may be located on the same plane. Also, the thickness of the base layer 110, the thickness of the n-type semiconductor layer 120, the thickness of the active layer 130, and the thickness of the p-type semiconductor layer 140 may be the same.

The first p-type electrode 161 may be disposed on the lower surface of the p-type semiconductor layer 140, and the second p-type electrode 162 may be disposed on the upper surface of the p-type semiconductor layer 140. Also, the first and second p-type electrodes 161 and 162 may be closer to the outer surface of the p-type semiconductor layer 140 than to the inner surface of the p-type semiconductor layer 140. Also, the areas of each of the first and second p-type electrodes 161 and 162 may be smaller than the areas of the lower surface and the upper surface of the p-type semiconductor layer 140.

The first protective layer 171 may be in contact with the side surface of the first p-type electrode 161. Also, the first protective layer 171 may cover a part of the upper surface of the first p-type electrode 161, but is not limited thereto. The second protective layer 172 may be in contact with the side surface of the second p-type electrode 162. Also, the second protective layer 172 may cover a part of the upper surface of the second p-type electrode 162, but is not limited thereto.

Figure 16:
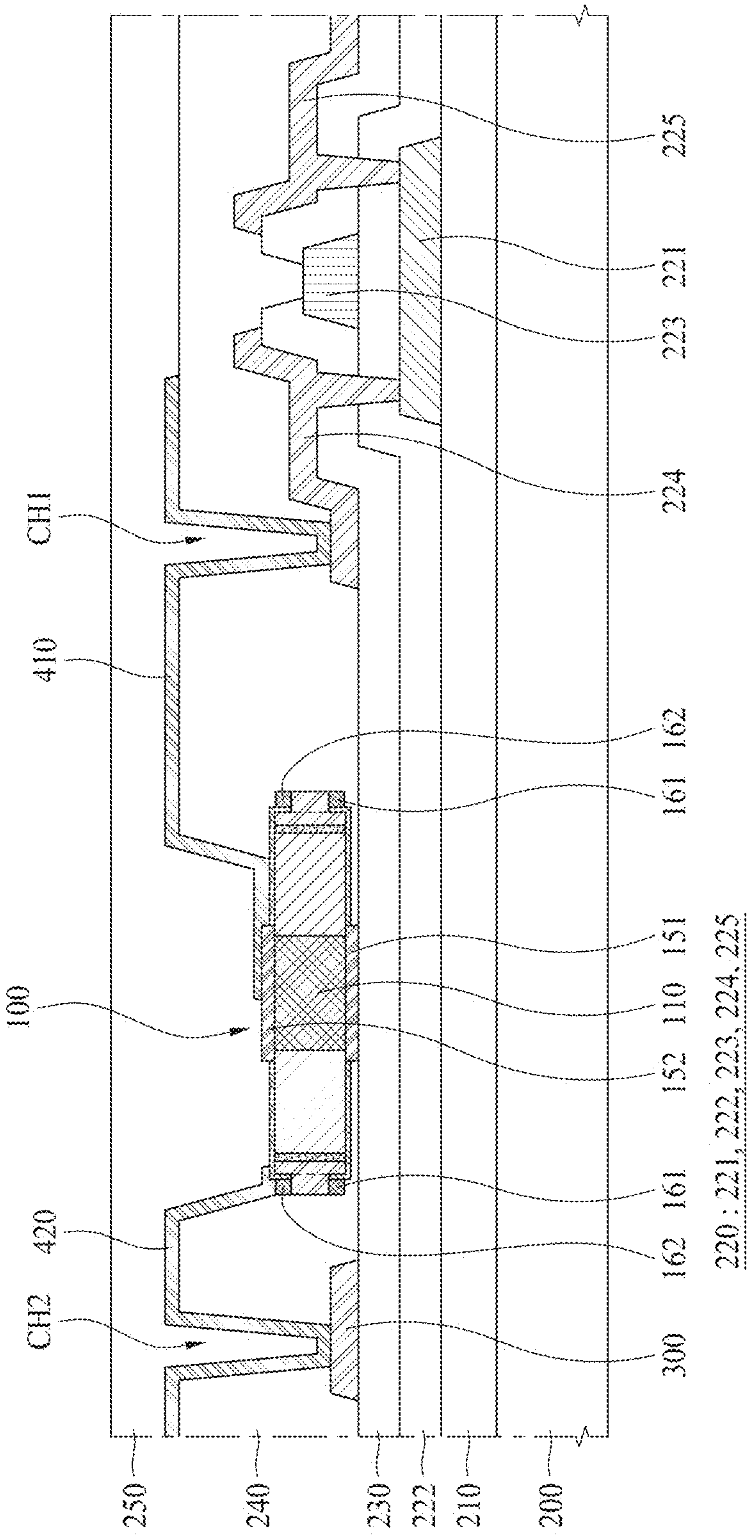
FIG. 16 is a cross-sectional view of a display device according to an embodiment of the present disclosure.

FIG. 16 is a cross-sectional view of a display device according to an embodiment of the present disclosure. FIG. 16 shows any one pixel.

Referring to FIG. 16, the pixel according to an embodiment of the present disclosure may include a light emitting diode 100, a substrate 200, a buffer layer 210, a thin film transistor 220, an interlayer insulating layer 230, a first planarization layer 240, a second planarization layer 250, a common voltage line 300, a first connection electrode 410, and a second connection electrode 420.

The light emitting diode 100 may have a structure of the light emitting diode 100 shown in FIGS. 1 through 15. FIG. 16 illustrates a structure of the light emitting diode 100 shown in FIG. 14.

The substrate 200 may be formed of glass or plastic, but is not limited thereto. The display device according to an embodiment of the present disclosure may be configured in a top emission method in which the emitted light is emitted upward. Accordingly, as the material of the substrate 200, not only a transparent material but also an opaque material may be used.

The buffer layer 210 may be disposed on the substrate 200. The buffer layer 210 may reduce or prevent oxygen or hydrogen from penetrating into the thin film transistor 220 through the substrate 200. Furthermore, the buffer layer 210 may be formed of an inorganic insulating material, such as silicon oxide (SiOx), silicon nitride (SiNx), silicon oxynitride (SiOxNy).

The thin film transistor 220 may be disposed on the substrate 200. The thin film transistor 220 may include a semiconductor layer 221, a gate insulating layer 222, a gate electrode 223, a source electrode 224, and a drain electrode 225.

The semiconductor layer 221 may be disposed on the buffer layer 210. The semiconductor layer 221 may include a poly-silicon semiconductor or an oxide semiconductor. In addition, when the semiconductor layer 221 includes an oxide semiconductor, at least one oxide of indium-gallium-zinc-oxide (IGZO), indium-gallium-tin-oxide (IGTO), and indium-gallium-oxide (IGO) may be included.

The gate electrode 223 may be disposed on the semiconductor layer 221. For insulating the semiconductor layer 221 from the gate electrode 223, a gate insulating layer 222 may be disposed between the semiconductor layer 221 and the gate electrode 223. The gate insulating layer 222 may be formed of a single layer of silicon nitride (SiNx) or silicon oxide (SiOx) or multiple layers thereof. Also, although FIG. 16 shows a top gate structure in which the gate electrode 223 is disposed on the semiconductor layer 221, it is not limited thereto. For example, a bottom gate structure in which the semiconductor layer 221 is disposed on the gate electrode 223 may be disclosed.

The source electrode 224 and the drain electrode 225 may be disposed on the gate electrode 223 while facing each other. The interlayer insulating layer 230 may be disposed between the source electrode 224 and the gate electrode 223 and between the drain electrode 225 and the gate electrode 223. The interlayer insulating layer 230 may be formed of an inorganic insulating material, such as silicon oxide (SiOx), silicon nitride (SiNx), silicon oxynitride (SiOxNy).

The common voltage line 300 may be disposed on the interlayer insulating layer 230. The common voltage line 300 may apply a common voltage to the light emitting diode 100. Also, the common voltage line 300 may be formed of the same material as the source electrode 224 and the drain electrode 225, but is not limited thereto.

The light emitting diode 100 may be disposed on the interlayer insulating layer 230, but is not limited thereto. For example, an insulating layer may be further disposed between the light emitting diode 100 and the thin film transistor 220, and between the light emitting diode 100 and the common voltage line 300.

The first planarization layer 240 may be disposed on the interlayer insulating layer 230. The first planarization layer 240 may surround a side surface of the light emitting diode 100. Also, the first planarization layer 240 may expose portions of upper surfaces of the second p-type electrode 162 and the second n-type electrode 152 of the light emitting diode 100. The first n-type electrode 151 of the light emitting diode 100 may be in contact with the interlayer insulating layer 230. Also, the first p-type electrode 161 of the light emitting diode 100 may be covered by the first planarization layer 240.

The first planarization layer 240 may cover the thin film transistor 220 and the common voltage line 300. Also, the first planarization layer 240 may include a first contact hole CH1 exposing a portion of an upper surface of the source electrode 224 of the thin film transistor 220 and a second contact hole CH2 exposing a portion of an upper surface of the common voltage line 300.

The first planarization layer 240 may be formed of an organic insulating material such as an acrylic resin, an epoxy resin, a phenolic resin, a polyamide resin, or a polyimide resin.

The first connection electrode 410 may be disposed on the first planarization layer 240. Through the first contact hole CH1, the first connection electrode 410 may be electrically connected with the source electrode 224 of the thin film transistor 220, and may be electrically connected with the second n-type electrode 152.

The second connection electrode 420 may be disposed on the first planarization layer 240. The second connection electrode 420 may be electrically connected to the common voltage line 300 through the second contact hole CH2.

Accordingly, a voltage applied to the source electrode 224 of the thin film transistor 220 may be transmitted to the second n-type electrode 152 through the first connection electrode 410. Also, a voltage applied to the common voltage line 300 may be transmitted to the second p-type electrode 162 through the second connection electrode 420. Thus, the light emitting diode 100 may emit light by different voltage levels transmitted from each of the source electrode 224 and the common voltage line 300. The first n-type electrode 151 that is not electrically connected with the thin film transistor 220 through the first connection electrode 410 may float. Also, the first p-type electrode 161 that is not electrically connected with the common voltage line 300 through the second connection electrode 420 may float.

The first and second connection electrodes 410 and 420 may include a metal material such as Au, W, Pt, Si, Ir, Ag, Cu, Ni, Ti, or Cr, and an alloy thereof. Alternatively, the first and second connection electrodes 410 and 420 may include a transparent conductive material such as an indium tin oxide (ITO) or an indium zinc oxide (IZO). Also, the first and second connection electrodes 410 and 420 may include the same material, but are not limited thereto.

The second planarization layer 250 may be disposed on the first planarization layer 240. The second planarization layer 250 may cover an upper surface of the light emitting diode 100. Also, the second planarization layer 250 may fill inside of the first and second contact holes CH1 and CH2. Also, the second planarization layer 250 may be formed of the same material as the first planarization layer 240, but is not limited thereto.

According to the present disclosure, the following advantageous effects may be obtained.

According to the present disclosure, the plurality of light conversion layers may be formed so that light efficiency may be improved, and reflectance due to external light may be reduced.

It will be apparent to those skilled in the art that the present disclosure described above is not limited by the above-described embodiments and the accompanying drawings and that various substitutions, modifications and variations can be made in the present disclosure without departing from the spirit or scope of the disclosures. Consequently, the scope of the present disclosure is defined by the accompanying claims and it is intended that all variations or modifications derived from the meaning, scope and equivalent concept of the claims fall within the scope of the present disclosure.

What is claimed is:

1. A light emitting diode, comprising:
a base layer;
a first semiconductor layer surrounding a side surface of the base layer;
a first electrode on a first surface of the first semiconductor layer, the first electrode electrically connected with the first semiconductor layer; and
a second electrode on a second surface of the first semiconductor layer that is opposite to the first surface, the second electrode electrically connected with the first semiconductor layer,
wherein the first electrode and the second electrode overlap each other.

2. The light emitting diode of claim 1, wherein:
the first electrode covers an entire first surface of the base layer;
the first electrode covers a partial area of the first surface of the first semiconductor layer;
the second electrode covers an entire second surface of the base layer, the second surface of the base layer being opposite to the first surface of the base layer; and
the second electrode covers a partial area of the second surface of the first semiconductor layer.

3. The light emitting diode of claim 1, wherein a surface of the base layer and the second surface of the first semiconductor layer are located on a same plane.

4. The light emitting diode of claim 1, further comprising:
an active layer surrounding a side surface of the first semiconductor layer;
a second semiconductor layer surrounding a side surface of the active layer;
a third electrode on a first surface of the second semiconductor layer, the third electrode electrically connected with the second semiconductor layer; and
a fourth electrode on a second surface of the second semiconductor layer that is opposite to the first surface of the second semiconductor layer, the fourth electrode electrically connected with the second semiconductor layer,
wherein the third electrode and the fourth electrode overlap each other.

5. The light emitting diode of claim 4, wherein the second semiconductor layer includes a first region having a first thickness and a second region having a second thickness that is smaller than the first thickness, and the first region is between the second region and the active layer.

6. The light emitting diode of claim 5, wherein a thickness of the base layer, a thickness of the first semiconductor layer, and a thickness of the first region of the second semiconductor layer are all same.

7. The light emitting diode of claim 5, wherein the third electrode and the fourth electrode are on the second region.

8. The light emitting diode of claim 4, wherein a thickness of the base layer, a thickness of the first semiconductor layer, and a thickness of the second semiconductor layer are all same.

9. The light emitting diode of claim 4, further comprising:
a first protective layer that exposes the first and third electrodes, the first protective layer covering the first surface of the first semiconductor layer, a first surface of the active layer, and a first surface of the second semiconductor layer; and
a second protective layer that exposes the second and fourth electrodes, the second protective layer covering the second surface of the first semiconductor layer, a second surface of the active layer that is opposite to the first surface of the active layer, and a second surface of the second semiconductor layer that is opposite to the first surface of the second semiconductor layer.

10. The light emitting diode of claim 4, wherein
a first region of the light emitting diode above a reference line and a second region of the light emitting diode below the reference line are symmetrical, the reference line passing through a center of the base layer and parallel to a surface of the base layer.

11. The light emitting diode of claim 4, wherein a first region of the light emitting diode at a first side of a reference line and a second region of the light emitting diode at a second side of the reference line are symmetrical, the reference line passing through a center of the base layer and perpendicular to a surface of the base layer.

12. The light emitting diode of claim 1, wherein the base layer comprises an undoped material.

13. The light emitting diode of claim 1, wherein the base layer has a cylindrical shape.

14. A display device, comprising:
a common voltage line;
a thin film transistor on a substrate; and
a light emitting diode on the substrate, the light emitting diode including a first semiconductor layer, a second semiconductor layer surrounding a side surface of the first semiconductor layer, a first electrode electrically connected with the first semiconductor layer, a second electrode electrically connected with the first semiconductor layer, a third electrode electrically connected with the second semiconductor layer, and a fourth electrode electrically connected with the second semiconductor layer,
wherein one of the first electrode and the second electrode is electrically connected with the thin film transistor through a first connection electrode, and
wherein one of the third electrode and the fourth electrode is electrically connected with the common voltage line through a second connection electrode.

15. The display device of claim 14, wherein another one of the first electrode and the second electrode that is not electrically connected with the thin film transistor is floating and another one of the third electrode and the fourth electrode that is not electrically connected with the common voltage line is floating.

16. A light emitting diode, comprising:
a base layer including a first surface and a second surface opposite to the first surface of the base layer;
a first semiconductor layer including a first surface and a second surface opposite to the first surface of the first semiconductor layer, the first semiconductor layer in contact with a side surface of the base layer and surrounding the side surface of the base layer, the first surface of the first semiconductor layer located on a same plane as the first surface of the base layer;
an active layer including a first surface and a second surface opposite to the first surface of the active layer, the active layer in contact with a side surface of the first semiconductor layer and surrounding the side surface of the first semiconductor layer, the first surface of the active layer located on the same plane as the first surface of the first semiconductor layer;

a second semiconductor layer including a first surface and a second surface opposite to the first surface of the second semiconductor layer, the second semiconductor layer in contact with a side surface of the active layer and surrounding the side surface of the active layer, the first surface of the second semiconductor layer located on the same plane as the first surface of the active layer;

a first pair of overlapping electrodes on the first surface and the second surface of the first semiconductor layer and the first surface and the second surface of the base layer, the first pair of overlapping electrodes electrically connected with the first semiconductor layer; and a second pair of overlapping electrodes on the first surface and the second surface of the second semiconductor layer, the second pair of overlapping electrodes electrically connected with the second semiconductor layer.

17. The light emitting diode of claim 16, wherein:

a first electrode of the first pair of overlapping electrodes is on the first surface of the first semiconductor layer;

a second electrode of the first pair of overlapping electrodes is on the second surface of the first semiconductor layer;

a first electrode of the second pair of overlapping electrodes is on the first surface of the second semiconductor layer; and a second electrode of the second pair of overlapping electrodes is on the second surface of the second semiconductor layer.

18. The light emitting diode of claim 16, wherein:

the second surface of the first semiconductor layer is located on a same plane as the second surface of the base layer;

the second surface of the active layer is located on the same plane as the second surface of the first semiconductor layer; and the second surface of the second semiconductor layer is located on the same plane as the second surface of the active layer.

19. The light emitting diode of claim 16, wherein:

a first electrode of the first pair of overlapping electrodes covers an entirety of the first surface of the base layer and a portion of the first surface of the first semiconductor layer;

a second electrode of the first pair of overlapping electrodes covers an entirety of the second surface of the base layer and a portion of the second surface of the first semiconductor layer;

a first electrode of the second pair of overlapping electrodes covers a portion of the first surface of the second semiconductor layer; and a second electrode of the second pair of overlapping electrodes covers a portion of the second surface of the second semiconductor layer.

20. The light emitting diode of claim 16, wherein the second semiconductor layer includes a first region having a first thickness and a second region having a second thickness that is smaller than the first thickness, and the first region is between the second region and the active layer.

* * * * *